(12) United States Patent
Saleniemi et al.

(10) Patent No.: US 8,594,832 B2
(45) Date of Patent: *Nov. 26, 2013

(54) DESIGNING DRILLING PATTERN FOR EXCAVATING ROCK CAVERN

(71) Applicant: Sandvik Mining & Construction Oy, Tampere (FI)

(72) Inventors: Tommi Saleniemi, Tampere (FI); Erkki Eilo, Tampere (FI); Ari Junnikkala, Nokia (FI); Jussi Koskelainen, Helsinki (FI); Jouko Muona, Siuro (FI); Martti Keskinen, Espoo (FI)

(73) Assignee: Sandvik Mining & Construction Oy, Tampere (FI)

( * ) Notice: Subject to any disclaimer, the term of this patent is extended or adjusted under 35 U.S.C. 154(b) by 0 days.

This patent is subject to a terminal disclaimer.

(21) Appl. No.: 13/758,374

(22) Filed: Feb. 4, 2013

(65) Prior Publication Data

US 2013/0151207 A1    Jun. 13, 2013

Related U.S. Application Data

(63) Continuation of application No. 12/520,186, filed as application No. PCT/FI2007/050710 on Dec. 19, 2007, now Pat. No. 8,392,014.

(30) Foreign Application Priority Data

Dec. 22, 2006   (FI) ...................................... 20065854

(51) Int. Cl.
   *G06F 19/00*   (2011.01)
   *E21B 44/00*   (2006.01)

(52) U.S. Cl.
   USPC .......................................................... 700/182

(58) Field of Classification Search
   USPC ............................................ 700/182; 102/312
   See application file for complete search history.

(56) References Cited

U.S. PATENT DOCUMENTS

| 4,698,570 A | 10/1987 | Satoh |
| 6,293,355 B1 | 9/2001 | Koivunen et al. |

(Continued)

FOREIGN PATENT DOCUMENTS

| DE | 44 45 420 | 11/1995 |
| FI | 105942 | 10/2000 |
| JP | 7-218199 | * 8/1995 |

(Continued)

OTHER PUBLICATIONS

International Search Report mailed Apr. 29, 2008 issued in PCT Application No. PCT/FI2007/050710.
Finnish Office Action and Search Report mailed Nov. 29, 2007 issued in FI Applicant No. 02065854.
Japanese Office Action (with English Translation) issued in Japanese application No. 2009-542117 dated Jul. 28, 2011.

*Primary Examiner* — Sean P. Shechtman
*Assistant Examiner* — Steven Garland
(74) *Attorney, Agent, or Firm* — Morgan, Lewis & Bockius LLP

(57) ABSTRACT

A method and a storage device including a software product for designing a drilling pattern, and further a rock drilling rig, in the control unit of which a software product may be executed for designing the drilling pattern. For a group of holes of the drilling pattern, at least one master hole can be determined which comprises at least one dominating factor. The properties of at least one other drill hole are determined on the basis of the dominating properties of the master hole. A master hole may be a hole location master, hole depth master or hole direction master.

10 Claims, 8 Drawing Sheets

(56) References Cited

U.S. PATENT DOCUMENTS 6,772,105 B1 8/2004 Heck
6,957,707 B2 10/2005 Koivunen et al.
8,392,014 B2 * 3/2013 Saleniemi et al. ............ 700/182

FOREIGN PATENT DOCUMENTS

| JP | 11-081855 | 3/1999 |
| JP | 2005-511930 | 4/2005 |
| WO | 03/025341 | 3/2003 |

* cited by examiner

| Group of holes | Specific charge (q) | Charge ID | Hole Spacing | | Target E/V | Even |
|---|---|---|---|---|---|---|
| | | | Target | Max | | |
| Look-out profile | | | | | | |
| • bottom | q1 | c1 | $E_t1$ | $E_m1$ | 1,25 | x |
| • wall | q2 | c2 | $E_t2$ | $E_m2$ | | x |
| • roof | q3 | c3 | $E_t3$ | $E_m3$ | | x |
| Aid row 1 | | | | | | |
| • bottom | q4 | c4 | $E_t4$ | $E_m4$ | | x |
| • wall | q5 | c5 | $E_t5$ | $E_m5$ | | x |
| • roof | q6 | c6 | $E_t6$ | $E_m6$ | | x |
| Aid row 2 | | | | | | |
| • bottom | q7 | c7 | $E_t7$ | $E_m7$ | | x |
| • wall | q8 | c8 | $E_t8$ | $E_m8$ | | x |
| • roof | q9 | c9 | $E_t9$ | $E_m9$ | | x |

DESIGNING DRILLING PATTERN FOR EXCAVATING ROCK CAVERN

CROSS REFERENCE TO RELATED APPLICATIONS

This application is a continuation of U.S. application Ser. No. 12/520,186, filed Jul. 30, 2009, which is hereby incorporated by reference, and which is the National Stage of International Application No. PCT/FI2007/050710, filed Dec. 19, 2007, and claims the benefit of Finnish Application No. 20065854, filed Dec. 22, 2006.

BACKGROUND OF THE INVENTION

The invention relates to designing a drilling pattern for excavating a rock cavern. The drilling pattern defines for a round to be drilled in the tunnel face at least the locations and hole direction angles of the drill holes in the coordinate system of the drilling pattern. In the method, a designer designs a drilling pattern with the assistance of a drilling pattern design program. An object of the invention is described in more detail in the preamble of the first independent claim.

The invention also relates to a software product according to the second independent claim, the execution of which in a design computer generates actions required in designing a drilling pattern. Further, the invention relates to a rock drilling rig described in the preamble of the third independent claim, in the control unit of which a software product may be executed to generate actions required in designing a drilling pattern.

Tunnels, underground storage halls and other rock caverns are excavated in rounds. In the tunnel face, drill holes are drilled which are charged and blasted after drilling. Rock material of the amount of one round is detached from the rock at one blasting time. For excavating the rock cavern, a design is made in advance and information on the rock type, for example, is determined. In general, also the orderer of the rock cavern sets various quality requirements for the cavern to be excavated. Further, a drilling pattern is designed as office work for each round, the pattern being provided for the rock drilling rig to drill drill holes in the rock in such a way that a desired round can be formed.

For designing a drilling pattern, drilling pattern design programs have been provided which assist the designer in designing the pattern. Designing a drilling pattern is thus interactive action between the designer and the drilling pattern design program. A disadvantage of the present drilling pattern design programs is, however, that they are cumbersome and slow to use. Further, it is difficult to change finished drilling patterns later.

BRIEF DESCRIPTION OF THE INVENTION

An object of this invention is to provide a novel and improved method and software product for designing a drilling pattern. Further, an object is to provide a novel and improved rock drilling rig, in the control unit of which a drilling pattern can be generated in a computer-aided manner.

The method according to the invention is characterized by determining at least one master hole for at least one group of holes in the drill pattern; determining at least one dominating property for the master hole; determining, on the basis of the dominating property of the master hole, a property of at least one other drill hole; and using a master hole which can be edited later, which is addable or removable and the dominating properties of which are changeable.

The software product according to the invention is characterized in that executing the software product in a computer is arranged to generate at least the following actions: to create the drilling pattern interactively with a designer; to determine for the drilling pattern at least the locations and hole direction angles of the drill holes in the coordinate system of the drilling pattern for a round to be drilled in the rock; to position in the drilling pattern at least one group of holes and several drill holes in said group of holes; to determine for the drilling pattern for at least one group of holes at least one master hole which can be edited later; to determine at least one dominating property for the master hole; and to determine, on the basis of the dominating properties of the master hole, at least one property of at least one other drill hole.

The rock drilling rig according to the invention is characterized in that a software product is executable in the control unit of the rock drilling rig for designing a drilling pattern, the execution of which software product is arranged to generate at least the following actions: to create the drilling pattern interactively with a designer; to determine for the drilling pattern at least the locations and hole direction angles of the drill holes in the coordinate system of the drilling pattern for a round to be drilled in the rock; to position in the drilling pattern at least one group of holes and several drill holes in said group of holes; to determine for the drilling pattern for at least one group of holes at least one master hole which can be edited later; to determine at least one dominating property for the master hole; and to determine, on the basis of the dominating properties of the master hole, at least one property of at least one other drill hole.

An idea of the invention is that at least one master hole is determined for a group of holes in a drilling pattern. One or more dominating properties are determined for the master hole, and on the basis of the dominating properties of the master hole at least one property of at least one other drill hole is determined. The group of holes may be, for example, an end profile, an auxiliary line or a field hole element. Further, an idea of the invention is to use in the drilling pattern master holes that can be edited later in a versatile manner. Thus, master holes can be easily added and removed, and their location and other properties can be changed.

An advantage of the invention is that it is easier and faster to design a drilling pattern than before. The designer can concentrate on determining the location and properties of the master holes because the drilling pattern design program can automatically determine properties of holes dependent on the master holes. Further, the properties of the drilling pattern can be controlled better. Further, the dominating properties and the location of the editable master holes can be changed afterwards. Owing to this, it is easy and fast to edit the drilling pattern later. The designer may also use an old drilling pattern as the basis of a new pattern and to modify master holes in it in the way required by the new round to be drilled, which results in savings in the design work. Owing to good editability, the drilling pattern may have a long service life.

The idea of an embodiment is to determine at least two master holes for a group of holes in the drilling pattern. Between the master holes, there are one or more intermediate holes, at least one property of which is determined on the basis of the dominating properties of the master hole. In this solution, by means of the master holes it is possible to easily mark off the area of influence comprising one or more intermediate holes influenced by the master holes. The size of the area of influence may be edited afterwards by changing the location of the master holes.

The idea of an embodiment is to determine for each individual master hole an area of influence comprising one or more drill holes. The area of influence may be determined when the drilling pattern is designed, and it may be edited afterwards. The area of influence may be determined in such a way, for example, that it comprises a predetermined number of drill holes closest to the master hole, or drill holes at a predetermined absolute distance from the master hole. Further, the area of influence may be determined in such a way that the master hole has influence only in a given part of the pattern, for example in the bottom section or in the corner. Further, the area of influence may comprise drill holes positioned between the master hole and some part of the pattern, such as a corner point. The rule determining the area of influence of the master hole may be stored in the same editable data element as the dominating properties of the master hole. This application even allows positioning in desired sections only one master hole that affects a predetermined number of drill holes.

The idea of an embodiment is that the dominating property of a master hole is one of the following: location in the group of holes, depth, hole direction angle, degree of charge or hole spacing.

The idea of an embodiment is to display the drilling pattern to be designed in a graphic user interface and to move the master hole along the group of holes of the pattern to a desired location. The moving may take place for instance with a mouse in the user interface or a corresponding pointer device. Then, when the master holes are linked to the profile line, they are easy to move along the profile line during editing.

The idea of an embodiment is to convert any drill hole into a master hole, and vice versa. Thus, new kinds of drill hole elements can be easily formed in the group of holes.

The idea of an embodiment is to generate at least one new master hole freely at any location between the most remotest drill holes in the group of holes. Thus, a master hole may be added to the pattern also at the location where there is no previous drill hole.

The idea of an embodiment is to link the master hole to at least one data element stored beforehand in a memory and defining the dominating properties of the master hole. Thus, dominating properties of the master holes can be easily changed both during the designing and afterwards, for example by editing the contents of the given value table or by selecting another data element to be used.

The idea of an embodiment is to determine master holes at the bottom of the round in one or more groups of holes. Master holes may be determined at the bottom of the round, for instance on the blast plane positioned at such a distance from the navigation plane that corresponds to the length of the pattern. The drilling pattern may be designed with the angle of view being from the bottom of the round, in which case blasting-technical aspects are taken into consideration in designing the pattern. Master holes may be positioned in end profiles, aid rows and field hole elements determined for the blast plane.

The idea of an embodiment is to determine master holes in one or more groups of holes on the navigation plane. Designing the drilling pattern on the navigation plane is the conventional way. Master holes may be positioned in the start profile, aid rows and field hole elements determined for the navigation plane.

The idea of an embodiment is to determine at least one drill hole element in at least one group of holes of the drilling pattern. The drill hole element is formed by positioning a first hole location master and a second hole location master in the group of holes, whereby the part of the group of holes remaining between these holes forms the element line of the drill hole element, one or more intermediate holes being positioned on this line. Further, at least one common parameter is determined for the drill hole element, changing of which parameter affects the properties of the drill holes belonging to the element. By means of hole location masters, desired drill hole elements may be easily marked off from the group of holes. Further, since the shape of the element line corresponds to the section marked off by the master holes in the group of holes, the element line may comprise not only straight shapes but also curved ones as well as different combinations of curved and straight shapes.

The idea of an embodiment is to determine for the drill hole element a charge class, which defines at least a specific charge q, an average degree of charge I and a target hole spacing E. A drilling pattern design program allows intermediate holes to be automatically generated in the section between the hole location masters. The number and hole spacing of the intermediate holes to be generated is determined on the basis of the charge class of the drill hole element. The intermediate holes are positioned at substantially equal spacings in the section between the hole location masters in the drilling pattern, and they may be displayed in a graphic user interface.

The idea of an embodiment is to determine the target hole spacing E, whereby intermediate holes can be automatically generated by means of a drilling pattern design program. The number of intermediate holes is determined on the basis of the target hole spacing E. The intermediate holes are positioned in the section between the hole location masters in the drilling pattern, and they may be displayed in a graphic user interface.

The idea of an embodiment is to determine a maximum hole spacing E for the drill hole element, whereby the drilling pattern design program allows intermediate holes to be automatically generated for the drill hole element. The number of intermediate holes is determined to be the smallest possible in such a way that the greatest allowed hole spacing E is taken into account. The intermediate holes are positioned in the section between the hole location masters in the drilling pattern, and they may be displayed in a graphic user interface.

The idea of an embodiment is to determine at least two drill holes in the same group of holes in the drilling pattern to be hole depth masters and to give lengths to these holes. Depths are interpolated for the intermediate holes between two hole depth masters on the basis of the number of intermediate holes and the lengths of the hole depth masters. If required, this application allows the designer to deviate from the default depths determined by the basic dimensions in the drilling pattern, such as the y coordinates determined for the groups of holes.

The idea of an embodiment is to determine at least two drill holes in the same group of holes in the drilling pattern to be hole direction masters and to determine hole direction angles for these holes. Hole direction angles are interpolated for the intermediate holes between two hole direction masters on the basis of the number of intermediate holes and the hole direction angles of the hole direction masters. An advantage of this master hole type is good editability. If drill holes are later added or decreased between the hole direction masters or if values of hole direction masters are changed, the drilling pattern design program may perform new interpolation to determine the new hole direction angles of the intermediate holes.

The idea of an embodiment is to display a start profile in a graphic user interface and to determine hole direction angles for the hole direction masters in the end profile. Further, a look-out angle is calculated in the drilling pattern design program in such a way that the starting points of the hole direction masters of the end profile are attached to the start profile.

The idea of an embodiment is to determine for the drilling pattern at least one master hole having at least two simultaneous dominating properties.

The idea of an embodiment of the invention is to display a master hole in the user interface in a manner deviating from other drill holes. The master holes may be indicated in a graphic user interface for example by a different colour or hole symbol, compared with the other drill hole bottoms or starting points.

BRIEF DESCRIPTION OF THE FIGURES

Embodiments of the invention are described in more detail in the attached drawings, in which.

For the sake of clarity, embodiments of the invention are shown simplified in the figures. Similar parts are denoted with the same reference numerals.

DETAILED DESCRIPTION OF EMBODIMENTS OF THE INVENTION

Figure 1:
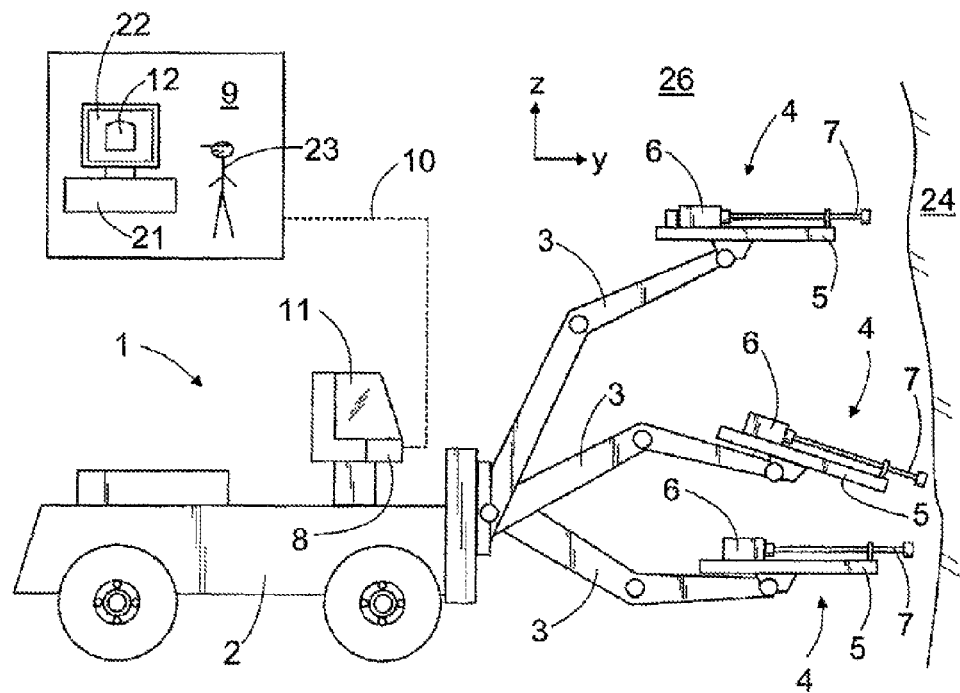
FIG. 1 shows schematically a side view of a rock drilling rig and means for designing a drilling pattern.

FIG. 1 shows a rock drilling rig 1 comprising a movable carrier 2, one or more drilling booms 3 and drilling units 4 arranged in the drilling booms 3. The drilling unit 4 comprises a feed beam 5 on which a rock drilling machine 6 can be moved by means of a feed device. Further, the drilling unit 4 comprises a tool 7 with which the impact pulses given by the percussion device of the rock drilling machine are transmitted to the rock to be drilled. The rock drilling rig 1 further comprises at least one control unit 8 arranged to control actuators of the rock drilling rig 1. The control unit 8 may be a computer or a corresponding device, and it may comprise a user interface with a display device as well as control means for giving commands and information to the control unit 8.

Typically, for drilling each round a drilling pattern 12 is designed in which at least the locations and the hole direction angles of the holes to be drilled in the coordinate system of the drilling pattern are determined, as are the lengths of the holes to be drilled. The drilling pattern may be designed in a location outside the drilling site, such as in an office 9, where it may be stored in a memory means, such as a memory stick or diskette, or it may be transmitted directly to the control unit 8 of the rock drilling rig by means of a data transmission connection 10 and stored in a memory member in it, such as a hard disk or memory diskette. Alternatively, designing and editing of the drilling pattern 12 may take place by means of the control unit 8, for instance in a cabin 11. Further, existing drilling patterns may be edited either on the drilling site or outside it. Designing a drilling pattern is computer-aided and usually iterative by nature. The drilling pattern design program is run in a design computer 21, control unit 8 or the like, and a designer 23 interacts with the drilling pattern design program and feeds required information, makes selections and controls the designing process. Pattern parts already designed may be iteratively edited during the design process to achieve a better final result.

Having been designed, the drilling pattern may be loaded to the control unit 8 of the rock drilling rig and implemented. The designed drill holes are drilled in rock 24 and charged and blasted. Rock material of the amount of a desired round is detached from the rock 24, and it is transported elsewhere. Subsequently, new drill holes are drilled for the next round according to the new drilling pattern 12.

Figure 2:
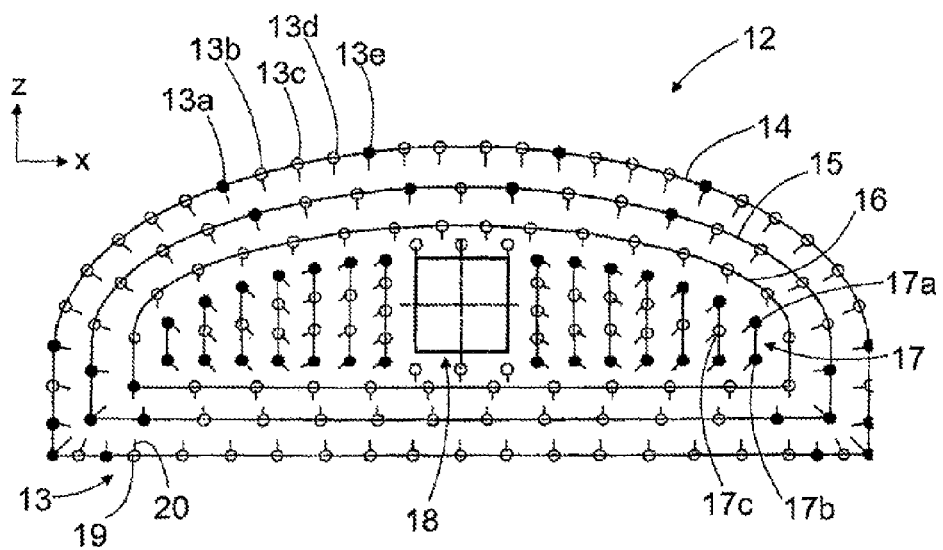
FIG. 2 shows schematically an xz projection of a drilling pattern.

FIG. 2 shows a drilling pattern 12 which may comprise several drill holes 13a to 13e arranged as groups of holes in several rows 14 to 16 within each other. Further, the drilling pattern may comprise field holes 17a to 17c arranged in the section between the innermost drill hole row 16 and a cut 18. Two or more field holes 17a to 17c may form a field hole element 17. Usually, the cut 18 also comprises several drill holes. The drill hole rows 14 to 16 within each other and the field hole elements may be called a group of holes. Also a start profile 32 on a navigation plane 28, mentioned later, may be some kind of a group of holes. When designing and editing a drilling pattern, such groups of holes may be handled as one entity, or a desired part may be marked off from them.

The outermost drill hole row is an end profile 14, the next inner drill hole row is a first aid row 15, the next inner row after that is a second aid row 16 etc. Thus, there may be one or more aid rows. In the drilling patter 12, the drill hole 13 may be shown as a circle 19, which may be either white or dark. Dark circles, such as the drill holes indicated by reference numerals 13a and 13e in FIG. 2, may be master holes, and the white circles indicated by reference numerals 13b to 13d may be intermediate holes. Further, the direction of each drill hole 13 may be denoted by a line of direction 20 in the drilling pattern 12. An xz projection of the drilling pattern 12 similar to the one in FIG. 2 may be shown in a graphic user interface 22 in the design computer 21 as well as in a graphic user interface in the control unit 8 of the rock drilling rig 1.

Figure 3:
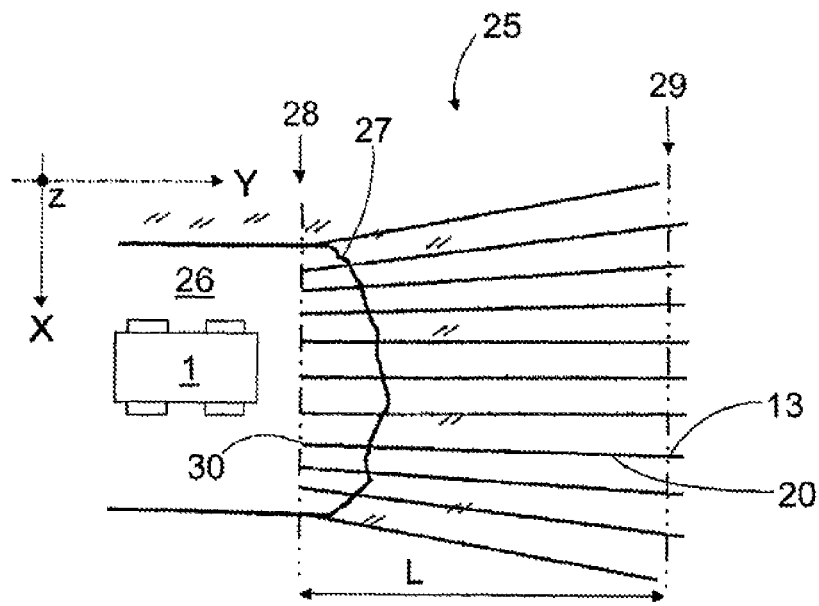
FIG. 3 shows schematically an xy projection, i.e. top view, indicating features related to the drilling pattern.

FIG. 3 shows the principle of the drilling pattern 12 in connection with a round 25 to be drilled. In the face 27 of a tunnel 26 to be excavated there is a navigation plane 28, to which the coordinate system of the drilling pattern 12 is attached. The navigation plane 28 is usually on the front side of the face 27 but sometimes it may be positioned at least partly inside the rock. The drilling pattern 12 may determine the location and direction of the rock drilling rig 1 in the coordinate system, in which case the rock drilling rig 1 is navigated in accordance with the coordinate system before starting the drilling. At the bottom of the round 25, there may still be a blasting layer 29, which is at a distance L corresponding to the length of the pattern from the navigation layer 28. When designing the drilling pattern 12, the locations 13 of the bottoms of the holes to be drilled may be positioned on the blast plane 29. The drilling pattern design program may be given the direction 20 of the hole to be drilled, whereby the drilling pattern design program can calculate the starting location 30 of the drill hole on the navigation plane 28 on the basis of the location 13 of the drill hole bottom and the drill hole direction 20. Alternatively, the drilling pattern design program may be given the starting location 30 of the drill hole on the navigation plane 28, whereby the drilling pattern design program can calculate the direction 20 of the drill hole on the basis of the location 13 of the drill hole bottom and the starting location 30 of the drill hole. The properties of the drill hole may be determined from the bottom of the round 25, from the blast plane 29 towards the navigation plane 28, whereas conventionally the determination takes place from the navigation plane towards the bottom of the round, in other words exactly in the opposite direction. On the blast plane 29, blasting-technical calculation may be performed when the locations 13 of the drill hole bottoms are designed.

In the final drilling pattern, the locations of all drill hole bottoms are not necessarily positioned on the blast plane because the bottom of the drilling pattern is typically shaped concave. In direction y, the field holes may extend farther than the holes of the end profile and the aid rows. However, the shaping of the bottom of the drilling pattern is carried out only after the locations of the drill hole bottoms have first been positioned on the same plane in the xz direction, for instance on the blast plane. This simplification facilitates the design process and improves clarity. The shaping of the bottom of the drilling pattern can be affected by means of the depths and hole direction angles of the drill holes.

Figure 4:
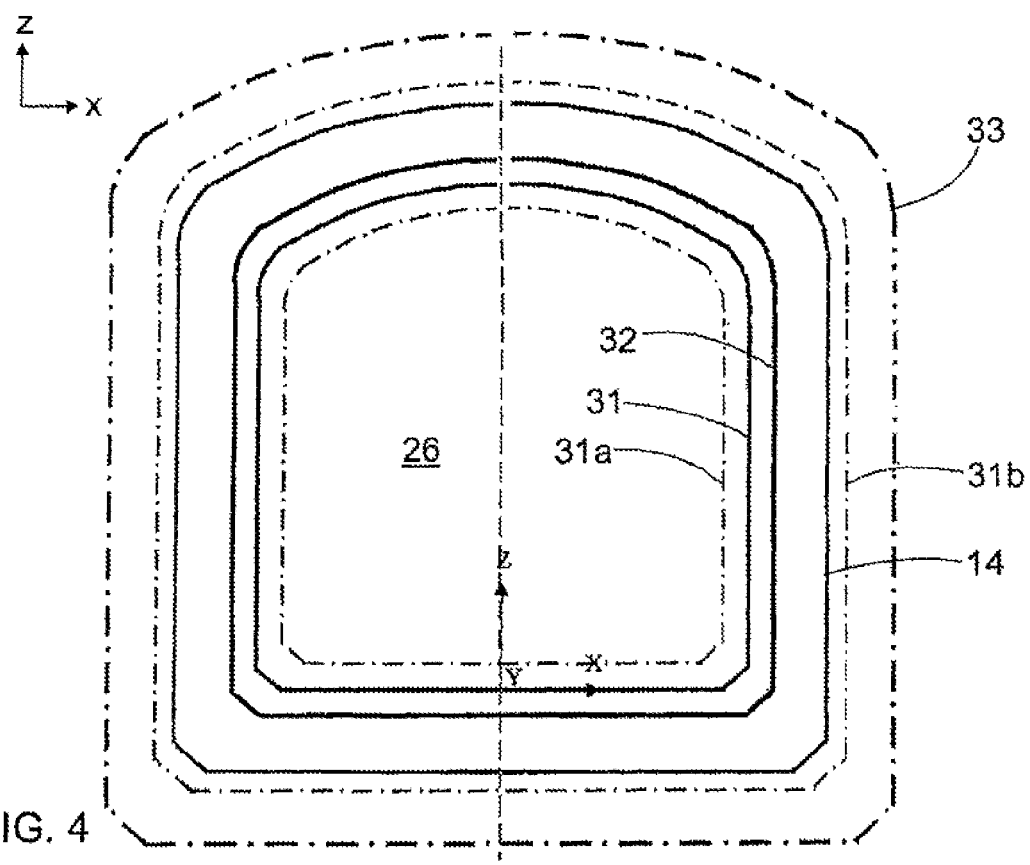
FIG. 4 shows schematically an xz projection of groups of holes in the drilling pattern.

FIG. 4 illustrates some profiles and groups of holes of the drilling pattern 12. A theoretical excavating profile 31 determined by the orderer of the rock cavern 26 is one of the basic pieces of information given to the drilling pattern design program. Further, the orderer may determine allowed tolerances 31a and 31b for the theoretical excavating profile 31. Furthermore, FIG. 4 shows a start profile 32 that may be determined for the navigation plane 28. Drilling the drill holes may be started on the navigation plane 28 from the start profile 32, in other words locations of the starting points of drill holes may be positioned in the start profile 32. The end profile 14, in turn, is a line combining the end points of the holes of the outermost drill hole profile. Further, the orderer may determine the greatest allowed cracking zone 33 for the rock cavern 26, which means that cracking caused by the blasting of a blasting agent is not allowed to extend beyond this zone in the surfaces limiting the rock cavern.

Figure 5:
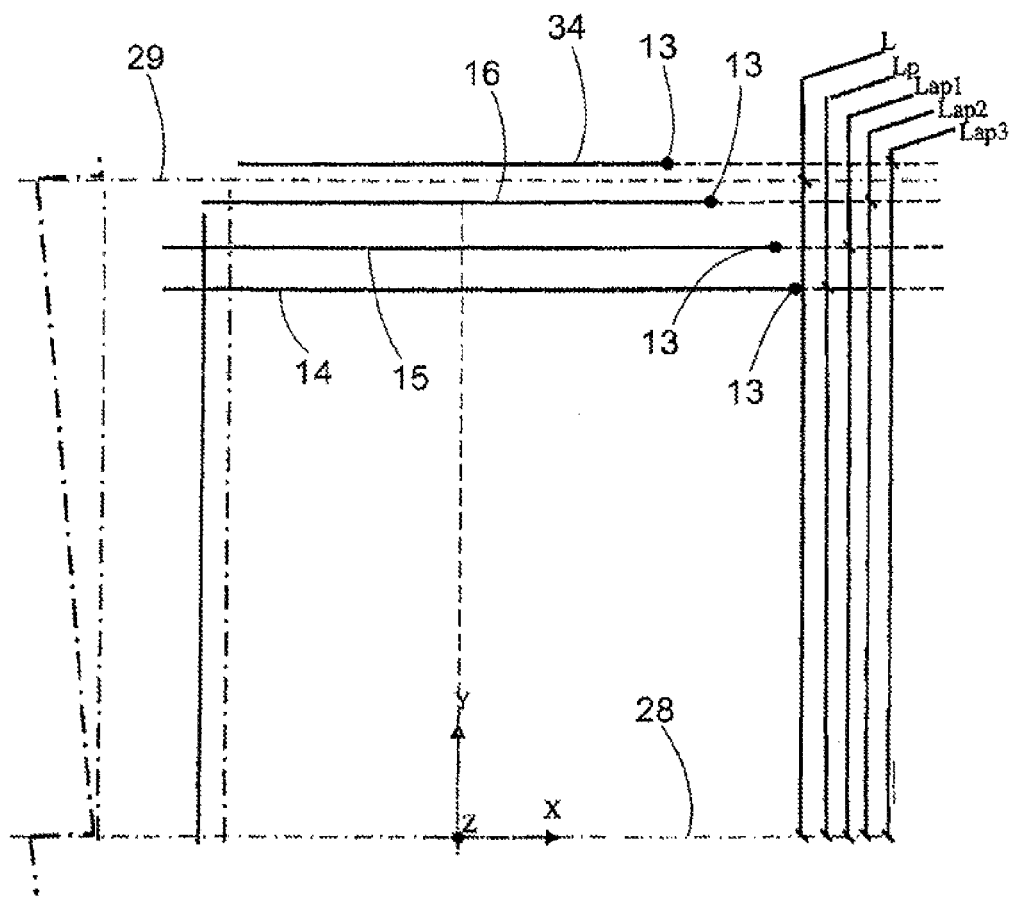
FIG. 5 shows schematically an xy projection of drill hole depths in different groups of holes of the drilling pattern.

FIG. 5 shows that the drill holes in different groups of holes 14, 15, 16 and 34 may have different depths. The depth of the end profile 14 is indicated as Lp, the depth of the outermost first aid row 15 is indicated as Lap1, the depth of the second aid row as Lap2 and the depth of the third aid row as Lap3. The length of the pattern, i.e. the distance between the navigation plane 28 and the blast plane 29, is indicated as L. The end points of the holes are indicated by references 13.

Figures 6A, 6B, 7:
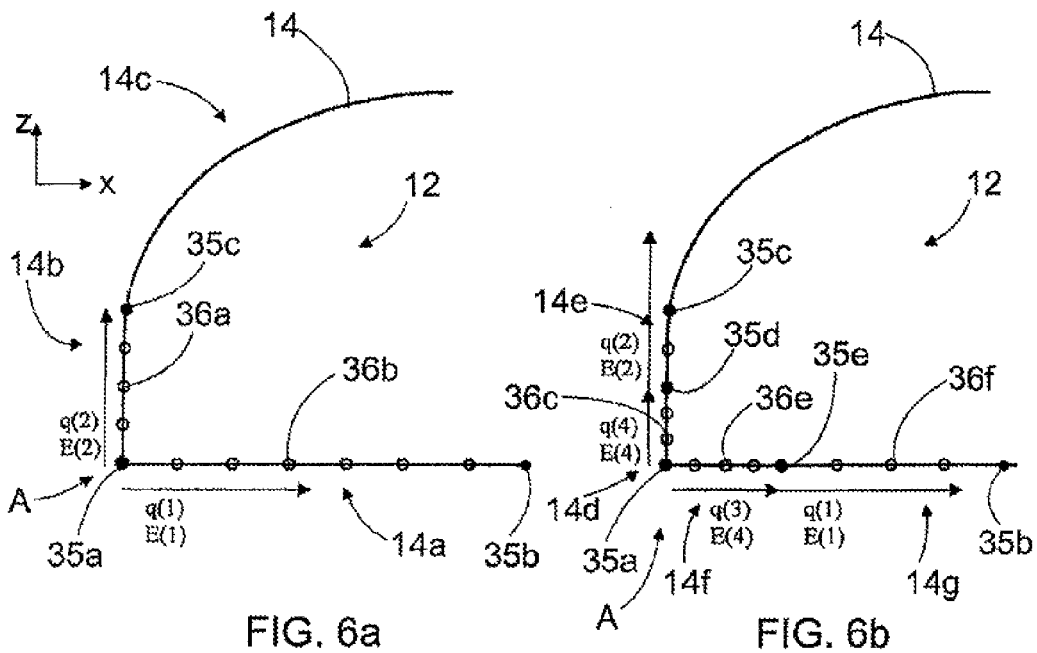
FIGS. 6a and 6b show schematically an xz projection of the positioning of the end points of drill holes in a group of holes.
FIG. 7 shows schematically a specific charge table.

FIGS. 6a and 6b illustrate positioning of the end points of the drill holes in a group of holes. Positioning the drill holes may be started from the end profile 14. When the locations of the drill holes have been positioned in the end profile 14, the drilling pattern design program may assist in determining the required aid rows. Positioning the end points of the drill holes in the group of holes may be iterative, in other words the locations of the drill hole bottoms in the group of holes may be changed later, if required. FIGS. 6a and 6b indicate the locations of the bottoms of hole location masters 35 with a black circle, and the locations of the bottoms of intermediate holes 36 between two hole location masters with a white circle.

Charge classes may be determined for the group of holes for the sections between the hole location masters 35. For example, the bottom of the end profile 14 may belong to a different charge class than the wall 14b of the end profile. Further, the curved roof 14c of the end profile 14 or any other section of the group of holes may be marked off by means of the hole location masters 35, and a separate charge class may be determined for this section. The different sections bottom, wall and roof of the group of holes may have a different specific charge (q1 to q4) due to their different quality requirements with regard to the cracking zone, for example. The charge class thus determines at least the specific charge q to be used. The given values of the parameters of the charge classes may be stored in a specific charge table similar to the one in FIG. 7, or the like. By using such preset parameters, the user can avoid unnecessary feeding of numerical data. The user can, however, change desired parameters and store new parameters in the specific charge table that may be taken as a starting point for the blasting-technical examination of the next pattern.

In practice, the designer positions hole location masters 35 in a group of holes, after which he/she determines the charge class of the section between the hole location masters 35. Subsequently, the drilling pattern design program may automatically position in the section between the hole location masters 35 equally spaced intermediate holes 36, the number of which corresponds to the charge class. The drilling pattern design program thus takes into account not only the specific charge degree but also the predefined maximum hole spacing or the target hole spacing. When the greatest allowed hole spacing has been determined for the element line between the hole location masters 35, the drilling pattern design program calculates the smallest possible number of holes and positions the intermediate holes on the element line in such a way that the greatest allowed hole spacing is not exceeded.

In FIG. 6a, the specific charge is q1 and the hole spacing E1 in the bottom section 14a between the hole location masters 35a and 35b. The wall section between the hole location masters 35a and 35c has, in turn, a different specific charge q2 and hole spacing E2. If he/she does not accept the location or number of intermediate holes 35 positioned by the drilling pattern design program, the designer may change them manually. Further, the designer may manually move a hole location master in a group of holes, delete a hole location master, add a hole location master or transform one of the intermediate holes to a hole location master.

FIG. 6b shows a situation where, compared with the situation of FIG. 6a, the designer has wished to add the number of locations of the drill hole bottoms in the left-hand corner A of the end profile 14. Thus, the designer has determined two new hole location masters 35d and 35e in the vicinity of the corner A. The designer may give a charge class to the section 14d between the hole location masters 35a and 35d and, correspondingly, to the section 14f between the hole location masters 35a and 35e. The drilling pattern design program positions intermediate holes 35 in the sections 14d and 14f on the basis of the parameters of the charge class. Alternatively, the designer may manually determine the required parameters, such as hole spacing E and specific charge q, for the sections 14d and 14f. The designer may determine the parameters and the charge class in such a way that the hole spacing E in the section marked off by the location maser holes 35 is as desired. This does not affect the other the marked off sections 14e and 14g, but their hole spacings E1 and E2 as well as specific charges q1 and q2 remain the same. If the designer wishes to remove for instance the hole location master 35d later, the situation gets back to what it was in FIG. 6a in this respect, i.e. between the hole location masters 35a and 35c there is a section 14b, in which the hole spacing is E2 and the specific charge q2. Also in other ways, the designer may afterwards edit the pattern by changing the location and number of hole location masters 35 as well as parameters related to them, and charge classes.

FIG. 7 shows a specific charge table in which parameters to be used as given values have been determined for blasting-technical examination and positioning of drill hole bottoms. Charge classes, the amount of blasting agent per unit of volume kg/m.sup.3, i.e. specific charge q, the identifier of the charges, i.e. charge ID, the target hole spacing $E_t$, and the greatest allowed hole spacing $E_m$ may be determined for each group of holes, such as end profile, aid rows and field elements. Further, it is possible to determine other parameters for the specific charge table, such as whether an even number of intermediate holes is desired for the section between the hole location masters. The use of the table expedites the design work and, if required, it is easy to edit the table. Blasting-technical calculation may utilize the formula $V=I/(q*E)$, where q is the specific charge, E is the hole spacing, V is the burden and I is the average degree of charge.

Figure 8:
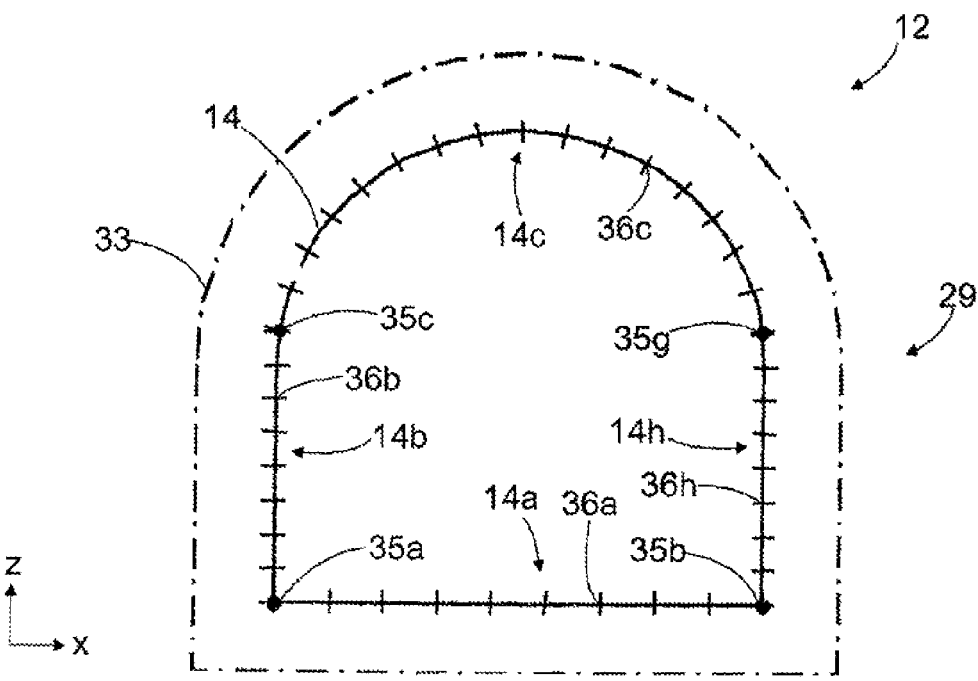
FIG. 8 shows schematically an xz projection of the locations of drill holes arranged in an end profile.

FIG. 8 shows a situation where the drilling pattern design program has set the locations of the bottoms of the intermediate holes 36a, 36b, 36c and 36h at equal spacings in different parts 14a, 14b, 14c and 14h of the end profile, which are marked off by means of the hole location masters 35a, 35b, 35c and 35g. For the sake of clarity, the locations of the intermediate hole bottoms are indicated by lines transverse to the element line of the end profile 14.

Figure 9:
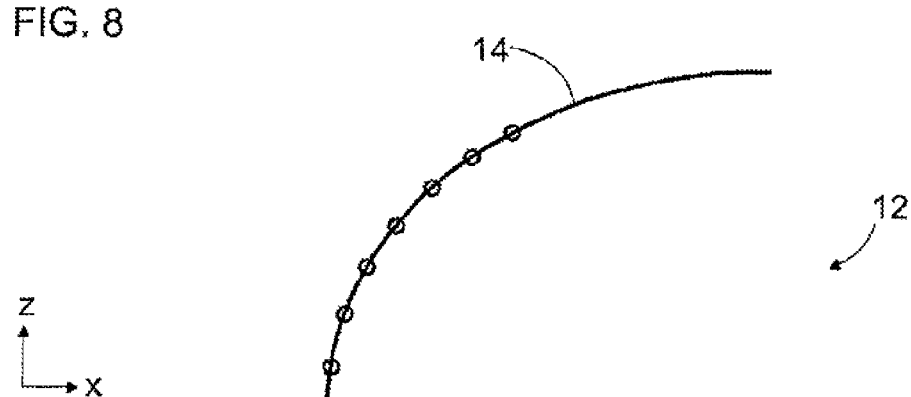
FIG. 9 shows schematically an xz projection of hole depth masters and intermediate holes arranged in the section of corner A in the drilling pattern.

FIG. 9 shows the corner A of the end profile 14, for which hole depth masters 45a, 45b and 45c are determined for the section of the bottom 14a. The designer may select as hole depth masters 45 drill holes already existing in the drilling pattern 12, or alternatively the designer may manually determine the locations of the hole depth masters in the drilling pattern for example by pointing with a mouse or a corresponding member or by giving their coordinates. The hole depth masters 45 determine the y-direction coordinates of the end points of the drill holes. Default depths may be determined for the hole depth masters 45 on the basis of the basic dimensions of the pattern. The basic dimensions include the L dimensions shown in FIG. 5, i.e. the length L of the pattern, the depth Lp of the end profile, the depth Lap1 of the first aid row etc. When the locations of the drill hole bottoms are positioned in the drill hole rows, their depth is determined by the default depth of the particular drill hole row. However, if he/she so wishes, the designer may edit hole depth masters 45 by giving them y coordinate values deviating from the default values. Further, the designer may add or delete hole depth masters and move them along the element line.

Figure 10:
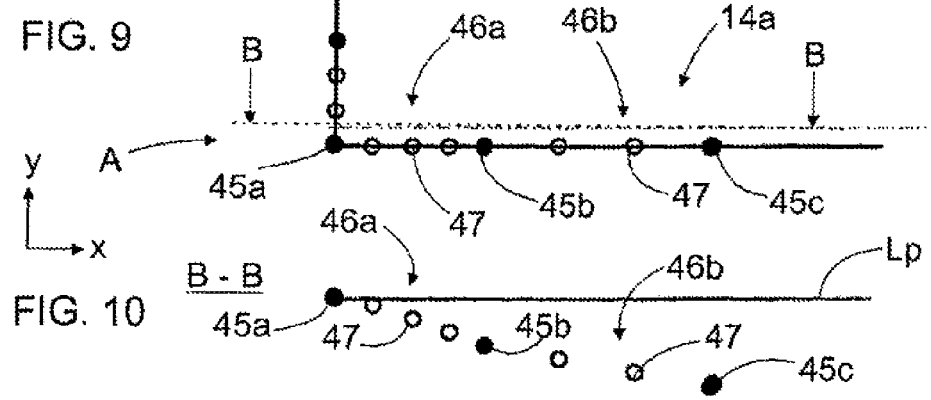
FIG. 10 shows schematically the principle of hole depth masters according to FIG. 8, seen from direction B-B.

FIG. 10 shows that the hole depth master 45a is positioned at the default depth Lp. Instead, the designer has determined the y coordinates of the hole depth masters 45b and 45c to deviate from the default depth Lp. In this case, the drilling pattern design program may interpolate depths for intermediate holes 47 in a section 46a between two hole depth masters 45a and 45b and correspondingly in a section 46b between two hole depth masters 45b and 45c on the basis of the number of intermediate holes 47 between the hole depth masters and the lengths of the hole depth masters 45. If intermediate holes 47 are later increased or decreased between hole depth masters 45 or if values of hole depth masters 45 are changed, the drilling pattern design program may perform new interpolation to determine new depths for the intermediate holes 47. The hole depth masters 45 enable the designer to deviate, if desired, from the default depths of the drill hole rows in desired sections of the drilling pattern. Hole depth masters 45 may be positioned anywhere in the group of holes.

Figure 11:
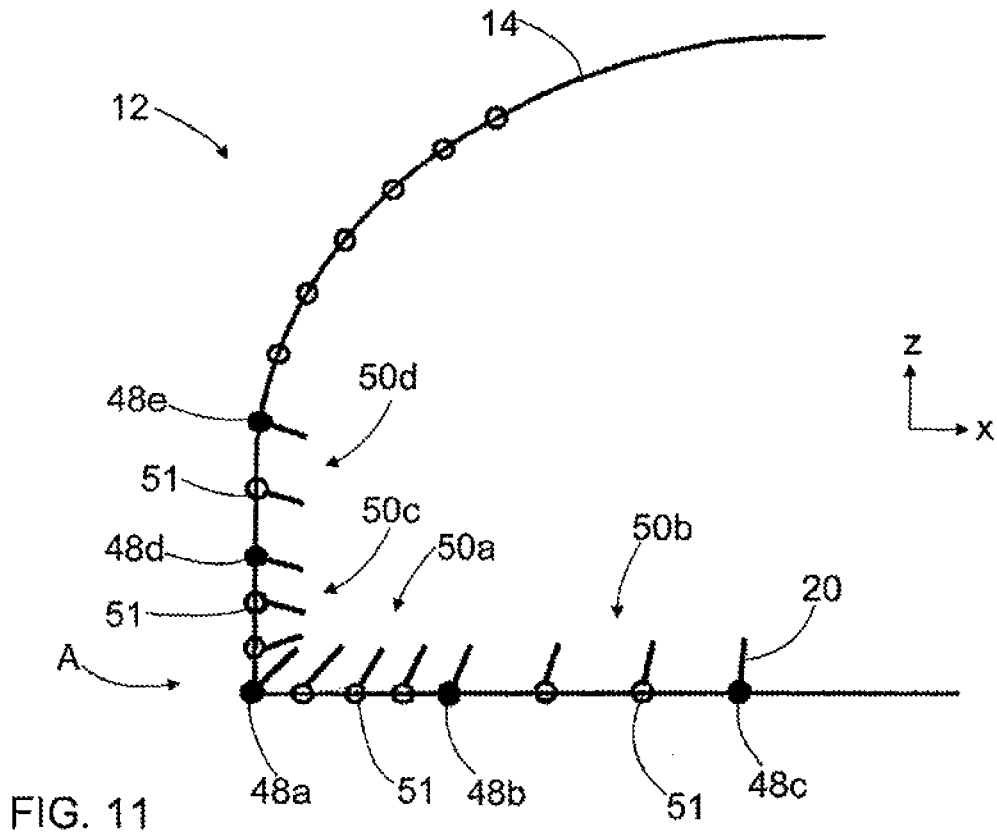
FIG. 11 shows schematically an xz projection of the effect of hole direction masters arranged in the section of corner A in the drilling pattern.

FIG. 11 shows the corner A of the end profile 14, where hole direction masters 48a to 48e are positioned, hole direction angles having been determined for these holes. The designer may select as hole direction masters 48 drill holes already existing in the drilling pattern 12, or alternatively the designer may manually determine the locations of the hole direction masters in the drilling pattern for example by pointing with a mouse or a corresponding member or by giving their coordinates. A hole direction angle may be illustrated in a graphical representation with a directional line 20 denoted in connection with a circle or the like representing the location of a drill hole. The hole direction masters 48a and 48b determine a section 50a between them, the section having intermediate holes 51. Correspondingly, the hole direction masters 48b and 48c determine a section 50b, the hole direction masters 48a and 48d determine a section 50c, and further, the hole direction masters 48d and 48e determine a section 50d. The drilling pattern design program may interpolate hole direction angles for the intermediate holes 51 between two hole direction masters 48 on the basis of the number of intermediate holes between the hole direction masters and the hole direction angles of the hole direction masters. If intermediate holes 51 are later increased or decreased between the hole direction masters 48 or if values of hole direction masters 48 are changed, the drilling pattern design program may perform new interpolation to determine the new hole direction angles of the intermediate holes 51.

Figure 12:
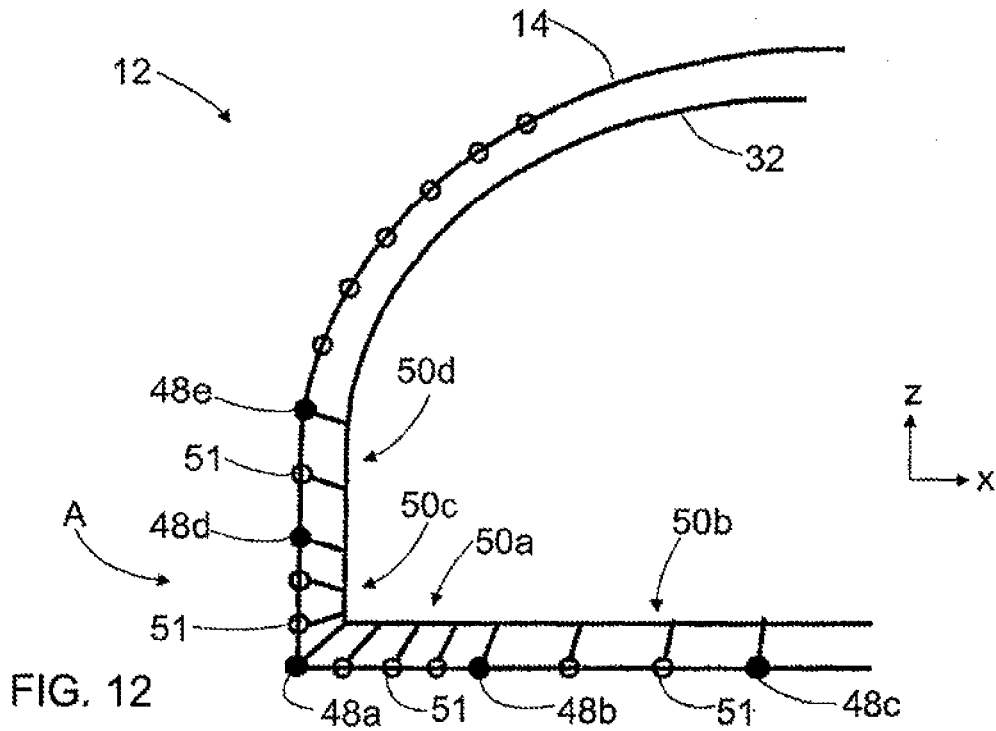
FIG. 12 shows schematically an xz projection of attachment of the starting points of the hole direction masters to a group of holes in the drilling pattern by means of a lock-to-profile function in the drilling pattern design program.

FIG. 12 shows the corner A of the end profile 14, where hole direction masters 48a to 48e are positioned, hole direction angles having been determined for these holes. The starting points of the hole direction masters in the end profile may be attached to one of the profiles of the drilling pattern, for instance to the start profile 32. For the attachment, the drilling pattern design program may comprise a lock-to-profile function, which facilitates the attachment of the starting points. In practice, the designer may determine the hole direction angles α of the hole direction masters in the end profiles, after which the drilling pattern design program calculates the look-out angles β in the drilling pattern design program in such a way that the starting points of the hole direction masters of the end profile are attached to the start profile 32. Subsequently, the drilling pattern design program may calculate the look-out angles β of the intermediate holes 51 in such a way that also the starting points of the intermediate holes are attached to the start profile 32. The hole direction angles α of the intermediate holes, in turn, may be interpolated on the basis of the hole direction angles of the hole direction masters. Thus, the look-out angles β are determined on the basis of the start profile 32, whereas the hole direction master determines the hole direction angles α. If, when the lock-to-profile function is on, the designer edits the position of a hole depth master bottom in the drilling pattern designed, for example by giving a y-direction coordinate or by giving a relative or absolute change in the direction of the drill hole, the starting points of the drill holes remain the same because they are attached to the start profile or the like. However, the drilling pattern design program updates the drilling pattern by calculating new hole direction angles α and look-out angles β for the drill holes.

Figure 13A:
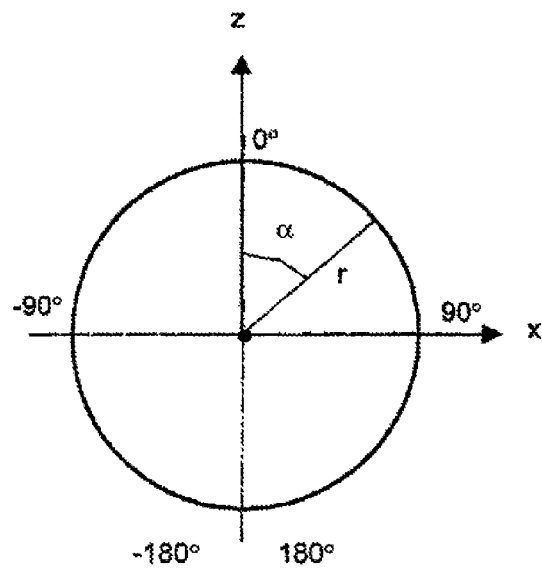
FIGS. 13a and 13b illustrate the concepts hole direction angle α and look-out angle β.
Figure 13B:
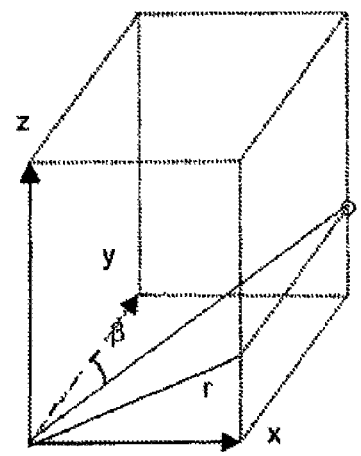

FIGS. 13a and 13b illustrate the concepts hole direction angle α and look-out angle β.

Further, it is possible that the user indicates with a pointer device, such as a mouse, the starting point of a drill hole in the start profile 32, after which the drilling pattern design program calculates the hole direction angles. These applications may also be used in groups of holes other than the end profile.

Figure 14:
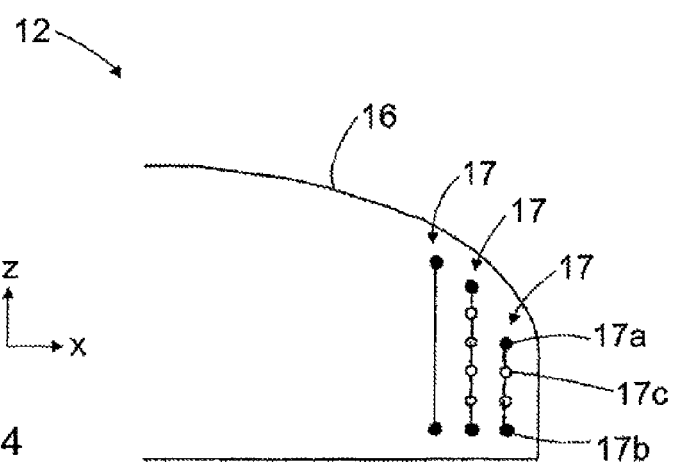
FIG. 14 shows schematically an xz projection of positioning of field hole elements in the drilling pattern.

FIG. 14 shows that master holes 17a, 17b may also be used in connection with field hole elements 17. When a drilling pattern is designed on the navigation plane 28, the designer may give the end points of the field hole element 17, between which an element line is formed. The drilling pattern design program may automatically determine the end points of the field hole element 17 to be hole location masters 17a, 17b. However, if desired, the designer may add master holes to the field hole element as well as move and delete them. Further, the drilling pattern design program may position intermediate holes 17c between the master holes 17a, 17b after the designer has given the number of intermediate holes to be positioned or alternatively the target hole spacing or the maximum hole spacing. The designer may also select the desired holes from the drill holes of the field hole element 17 to be hole direction masters and hole depth masters. When the drilling pattern is designed at the bottom of a round on the blast plane 29, the field hole elements 17 may be positioned on the basis of blasting-technical examination. In this case, too, the field hole element 17 may comprise master holes described in this application.

Figure 15:
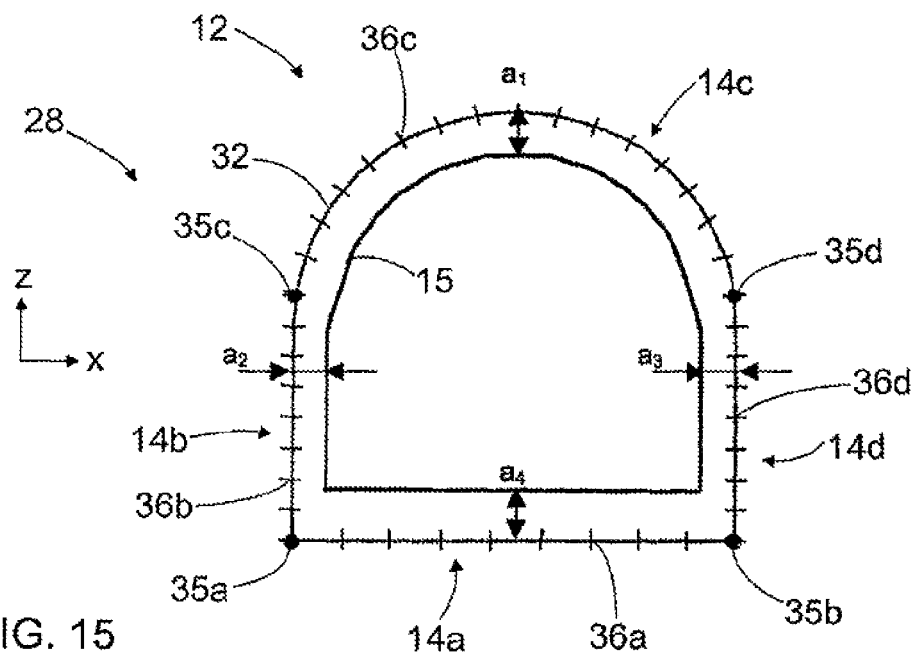
FIG. 15 shows schematically an xz projection of designing a drilling pattern on the navigation plane.

FIG. 15 illustrates designing of a drilling pattern 12 on the navigation plane 28. The designer may determine locations of the starting points of drill holes on the navigation plane 28 by means of hole location masters. The designer may position hole location masters 35a to 35d in the start profile 32 at desired points on the element line. Further, the designer may determine for the sections 14a to 14d the number of intermediate holes, the target hole spacing or the maximum hole spacing, after which the drilling pattern design program may automatically position intermediate holes 36a to 36d in sections 14a to 14d. If the designer later changes parameters of one of the sections, for example the target hole spacing, the drilling pattern design program redetermines the intermediate holes in this section. Furthermore, the designer may determine editable depth master and hole direction masters for the start profile 32. After the starting points of the drill holes have been positioned in the start profile, the required aid rows 15 may be determined within the start profile 32. The designer may give the drilling pattern design program distances a1 to a4 between the aid row 15 and the start profile 32, after which the drilling pattern design program may determine the aid row 15. Correspondingly, also other aid rows may be determined. The designer may position various master holes in aid rows as well.

It is to be noted that a drill hole in a group of holes may have two or more master hole properties simultaneously. Thus, for example a hole location master may be, at the same time, a hole depth master and a hole direction master. It is thus some kind of a multimaster hole.

It can be mentioned that instead of the term "section" used here, the term "drill hole element" may also be used for a section between two master holes. A drill hole element comprises an element line having a first master hole, a second master hole and between them one or more intermediate holes. The master holes are positioned in a drill-hole set, whereby the shape of the element line between them corresponds to the shape of the group of holes at the point of the drill hole element.

Figure 16:
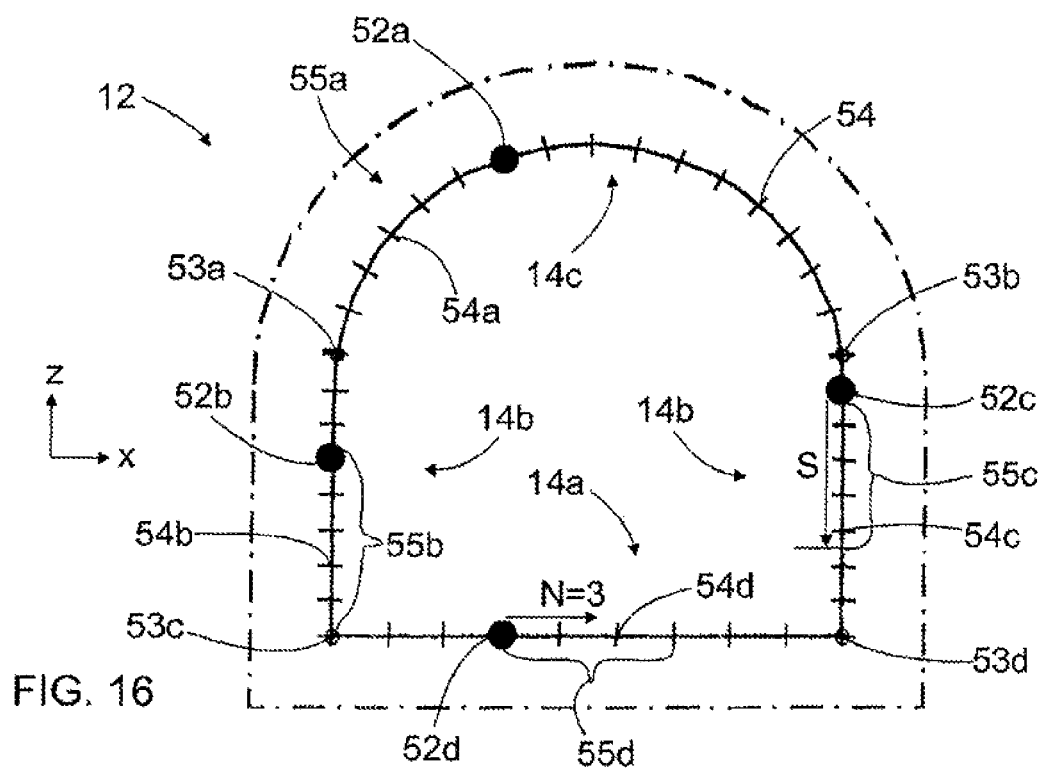
FIG. 16 shows schematically an xz projection of master holes, each of which has a predetermined area of influence.

FIG. 16 shows some further applications of master holes. Properties of sections of the drilling pattern 12, such as the bottom 14a, wall 14b and curved roof 14c, may be determined by positioning a master hole in each section. In FIG. 16, for example, the roof section 14c is provided with a master hole 52a that affects properties of intermediate holes 54a between end points 53a, 53b of the roof section 14c. Corresponding master holes may also be positioned in the wall sections 14b and the bottom section 14a. A rule according to which the area of influence 55a of the master holes is one of the sections 14a to 14c of the drilling pattern 12 has been determined for such master holes. Further, it is possible to position in the drilling pattern 12 a master hole 52b, whose area of influence 55b may be determined to be that section of the group of holes which remains between the master hole 52b and the corner point 53c of the pattern. In such a case, the dominating properties of the master hole 52b affect properties of the intermediate holes 54b. Instead of the corner points 53c, the area of influence may also be determined according to other end points 53a, 53b and not only by the corner points 53c, 53d. Further, the area of influence 55c of a master hole 52c may be determined as an absolute distance S, whereby the master hole 52c affects all intermediate holes 54c at this distance S. Further, a direction of influence has been determined for such a master hole 52c, indicated by an arrow in FIG. 16. Further, the drilling pattern may use a master hole 52d, for which the number N of closest drill holes 54d has been determined as the area of influence 55d. Still further, a direction of influence has been determined for such a master hole 52d, indicated by an arrow in the figure. The areas of influence 55c and 55d of the master holes 52c and 52d may be determined to extend in one direction or alternatively in two directions. Further, the size of the area of influence may be different in different directions. The area of influence may thus be, for example, the closest three drill holes to the right and the closest two drill holes to the left. A master hole may also have a combination of the above areas of influence, in other words it may cover the closest three drill holes in one direction and extend to the end point or the like of one section of the pattern in the other direction. Any rule other than the one described above may also be set to determine the area of influence 55 of the master hole 52. Dominating properties, location and determination of the area of influence of the master holes may be edited later. The rule determining the area of influence may be stored in the same file, data element or the like as the dominating properties of the master hole, or in a different one. A master hole with a predetermined area of influence may be of any type, in other words it may be a hole location master, a hole direction master, a hole depth master or any other master hole determining one or more properties.

The drilling pattern according to the invention may be edited in a versatile manner. A new drilling pattern may be designed by editing an old existing drilling pattern. In this way, time spent on the designing may be saved. Further, specific charges and hole direction angles proved previously to be working may be utilized. An old drilling pattern may be loaded from the system memory to serve as the basis of a new pattern. Subsequently, the designer may move drill hole elements in the pattern and delete them. The designer may also scale the drilling pattern to be larger or smaller. Further, the designer may add master holes to the drilling pattern and delete them. Correspondingly, the designer may edit the contents of the given value tables before loading them with a drilling pattern design program. The cut of an old drilling pattern may be used as such, or its location may be moved in the drilling pattern. Alternatively, the cut may be replaced with another cut, which may be loaded from another drilling pattern.

Still further, it is possible to change the length of the designed drilling pattern afterwards. The designer may select from the drilling pattern design program a function editing the length of the drilling pattern, whereby the drilling pattern design program can activate all depth master and hole direction masters in the drilling pattern. On the other hand, the designer may, if desired, remove the activation from the desired drill holes. After that, the designer may edit the depths of the active master holes in one of the ways described in this application. As a result of the editing, the length L of the drilling pattern changes. The designer may give master holes a new y-direction coordinate or change the length in the direction of a drill hole by giving the value of relative change or the absolute length in the direction of the drill hole. The simplest way is to edit the length of the drilling pattern by using relative change. The drilling pattern design program may have been given limit values, within which the length of the drilling pattern may be changed.

Further, the drilling pattern may be edited by stretching or reducing it as a whole in one direction or simultaneously in two or more directions.

For creating a drilling pattern, different given value tables, parameter tables and parameter files may be designed, and parameters stored in them may be loaded any time to be used by a drilling pattern design program. An alternative is, of course, that the designer gives parameters relating to a drill hole element manually to the drilling pattern design program.

A drilling pattern design program is a software product that may be executed in the processor of a computer, or the like. The software product may be stored in a memory member of the computer used in the designing, or it may be stored in a separate memory means, such as a CD-ROM. Further, the software product may be loaded to the computer used in the designing from a data network. Executing the drilling pattern design program is arranged to generate functions described in this application. The drilling pattern design program and the designer may work interactively and thus create a drilling pattern together.

In some cases, features described in this application may be used as such, irrespective of other features. On the other hand, features described in this application may be, if required, combined with each other to form different combinations.

The drawings and the related description are only intended to illustrate the idea of the invention. Details of the invention may vary within the scope of the claims.

What is claimed is:

1. A computer-implemented method for designing a drilling pattern for excavating rock, the method comprising instructions executed by a processor, the instructions comprising:
    determining for the drilling pattern at least a location and a hole direction angle of each drill hole in a coordinate system of the drilling pattern for a round to be drilled in the rock;
    positioning at least one group of holes in the drilling pattern, and several drill holes in said at least one group of holes;
    determining at least one master hole for the at least one group of holes in the drilling pattern;
    determining at least one dominating property for the at least one master hole;
    determining, on the basis of the at least one dominating property of the at least one master hole, a property of several other drill holes; and
    identifying an area of influence in the drilling pattern, the area of influence comprising one or more drill holes influenced by the at least one master hole,
    wherein the at least one master hole is editable to be added or removed and to change a dominating property,
    wherein the at least one dominating property is selected from the group consisting of a location in the at least one group of holes, a depth, a hole direction angle, a degree of charge, and a hole interval, and
    wherein the area of influence includes a predetermined number of drill holes closest to the at least one master hole, or drill holes at a predetermined absolute distance from the at least one master hole.

2. The computer-implemented method according to claim 1, wherein the instructions further comprise:
    determining for the at least one group of holes of the drilling pattern a first master hole and a second master hole, between which there are several intermediate holes, and
    determining at least one property of the intermediate holes on the basis of the dominating properties of the first and second master holes.

3. The computer-implemented method according to claim 1, wherein the area of influence comprising drill holes at the predetermined absolute distance also includes drill holes within the determined distance from the at least one master hole.

4. The computer-implemented method according to claim 1, wherein the instructions further comprise linking the at least one master hole to at least one data element stored beforehand in a memory, the dominating properties of the at least one master hole being determined in the data element.

5. The computer-implemented method according to claim 1, wherein the instructions further comprise:
    determining an end profile of a cavern to be excavated, the end profile being a line through bottoms of the drill holes of an outermost group of holes;
    determining several drill holes for the end profile;
    determining at least one aid row, which is a group of holes positioned within the end profile and comprises several drill holes through the bottoms of which an auxiliary line goes;
    positioning in the drilling pattern a cut comprising several drill holes;
    determining a field hole element comprising several field holes in the area between an aid row and the cut, and
    marking off, by means of the at least one master hole, one smaller group of holes from the at least one the following group of holes: end profile, aid row, cut and field hole element.

6. The computer-implemented method according to claim 1, wherein the instructions further comprise:
    determining a navigation plane for the drilling pattern;
    determining for the drilling pattern a blast plane, which is a plane positioned at a distance corresponding to a length of the pattern from a navigation plane at a bottom of the round; and
    determining at least one master hole for the at least one group of holes on the blast plane.

7. The computer-implemented method according to claim 1, wherein the instructions further comprise:
    determining a navigation plane of the drilling pattern; and
    determining at least one master hole for the at least one group of holes on the navigation plane.

8. The computer-implemented method according to claim 1, wherein the instructions further comprise:
providing the at least one master hole with at least two simultaneous dominating properties; and
determining, on the basis of the at least two dominating properties of the at least one master hole, properties of several other drill holes.

9. A non-transient computer-readable medium or media comprising coded instruction sets configured for execution by a processor in a computer the instructions comprising:
creating a drilling pattern interactively with a designer;
determining for the drilling pattern at least locations and hole direction angles of drill holes in a coordinate system of the drilling pattern for a round to be drilled in rock;
positioning in the drilling pattern at least one group of holes and several drill holes in said group of holes;
determining for the at least one group of holes of the drilling pattern at least one master hole;
determining at least one dominating property for the at least one master hole;
determining, on the basis of the at least one dominating property of the at least one master hole, at least one property of several other drill holes; and
identifying an area of influence in the drilling pattern, the area of influence comprising one or more drill holes influenced by the at least one master hole,
wherein the at least one dominating property is selected from the group consisting of a location in the at least one group of holes, a depth, a hole direction angle, a degree of charge, and a hole interval, and
wherein the area of influence includes a predetermined number of drill holes closest to the at least one master hole, or drill holes at a predetermined absolute distance from the at least one master hole.

10. A rock drilling rig, comprising:
a movable carrier;
at least one drilling boom;
at least one drilling unit in the drilling boom, the drilling unit comprising a feed beam and a rock drilling machine arranged to be moved on the feed beam by feed means; and
at least one control unit for controlling the rock drilling rig, the control unit comprising at least one computer;
a designing control unit comprising a software program product executable in the control unit for designing a drilling pattern, the execution of which software program product includes executing instructions, comprising:
creating the drilling pattern in a computer-aided manner with a designer;
determining for the drilling pattern at least locations and hole direction angles of drill holes in a coordinate system of the drilling pattern for a round to be drilled in the rock;
positioning in the drilling pattern at least one group of holes and several drill holes in said group of holes;
determining for the at least one group of holes of the drilling pattern at least one master hole;
determining at least one dominating property for the at least one master hole;
determining, on the basis of the dominating properties of the at least one master hole, at least one property of several other drill holes, and
identifying an area of influence in the drilling pattern, the area of influence comprising one or more drill holes influenced by the at least one master hole,
wherein the at least one dominating property is selected from the group consisting of a location in the at least one group of holes, a depth, a hole direction angle, a degree of charge, and a hole interval, and
wherein the area of influence includes a predetermined number of drill holes closest to the at least one master hole, or drill holes at a predetermined absolute distance from the at least one master hole.

\* \* \* \* \*